US009160365B2

(12) United States Patent
Gavin et al.

(10) Patent No.: US 9,160,365 B2
(45) Date of Patent: Oct. 13, 2015

(54) PROGRAMMING METHOD FOR TIRE PRESSURE MONITOR SENSORS

(71) Applicant: Bartec USA LLC, Sterling Heights, MI (US)

(72) Inventors: Michael John Gavin, Doncaster (GB); Colin Webb, West Yorkshire (GB); Steve Ascham, Sheffield (GB); Charles W. Beal, West Yorkshire (GB)

(73) Assignee: BARTEC USA LLC, Sterling Heights, MI (US)

( * ) Notice: Subject to any disclaimer, the term of this patent is extended or adjusted under 35 U.S.C. 154(b) by 78 days.

(21) Appl. No.: 14/068,604

(22) Filed: Oct. 31, 2013

(65) Prior Publication Data

US 2014/0122982 A1 May 1, 2014

Related U.S. Application Data

(60) Provisional application No. 61/720,434, filed on Oct. 31, 2012.

(51) Int. Cl.
*B60C 23/04* (2006.01)
*H03M 13/09* (2006.01)
*H03M 13/33* (2006.01)

(52) U.S. Cl.
CPC ........... *H03M 13/09* (2013.01); *B60C 23/0462* (2013.01); *B60C 23/0471* (2013.01); *B60C 23/0479* (2013.01); *B60C 23/0481* (2013.01); *H03M 13/333* (2013.01)

(58) Field of Classification Search
CPC ... H04L 1/0061; H04L 1/0057; H04L 12/417; H04L 1/0045; H04L 1/1809; H04L 1/188; H04L 1/0072; H04L 1/1628; H04L 1/1812; H04L 1/1845; H04L 1/00; H04L 1/16; H04L 1/1819; G06F 11/10; G06F 11/1004; B60C 23/0462; B60C 23/0471; B60C 23/0479; B60C 23/0481; H03M 13/09; H03M 13/333
USPC .......................... 714/748, 758, 749, 776, 807
See application file for complete search history.

(56) References Cited

U.S. PATENT DOCUMENTS

| 5,844,918 | A  | * | 12/1998 | Kato ............................. | 714/751 |
|-----------|----|---|---------|-----------------------------------|---------|
| 6,467,060 | B1 | * | 10/2002 | Malakapalli et al. .........      | 714/758 |
| 6,522,665 | B1 | * | 2/2003  | Suzuki et al. .................   | 370/471 |
| 6,865,240 | B1 | * | 3/2005  | Kawataka .....................    | 375/368 |
| 7,073,092 | B2 | * | 7/2006  | Okamoto et al. ...............    | 714/18  |
| 7,231,574 | B2 | * | 6/2007  | Gregg et al. .................    | 714/746 |
| 7,343,544 | B2 | * | 3/2008  | Koseki ..........................  | 714/769 |
| 7,870,470 | B2 | * | 1/2011  | Kim .............................  | 714/795 |
| 8,205,128 | B2 | * | 6/2012  | Yoo et al. ......................  | 714/748 |

(Continued)

*Primary Examiner* — James C Kerveros
(74) *Attorney, Agent, or Firm* — Harness, Dickey & Pierce, P.L.C.

(57) ABSTRACT

A method of programming a tire pressure monitor sensor utilizes a programming tool that transmits LF data frames to the TPMS sensor that includes a cyclic redundancy check (CRC) code with each data frame. The starting point for the subsequent data frame will then start with the CRC code received from the previous frame and will end with a new CRC code. Accordingly, the CRC code received from the previous frame will be used to ensure that the next data frame matches that CRC code as the starting point for that frame. This will ensure that the data frames cannot get out of sequence and will allow the ability to quickly identify where the data frames have gone out of sync and allow the programming tool to quickly react.

3 Claims, 1 Drawing Sheet

(56) References Cited

U.S. PATENT DOCUMENTS

Figure 1:
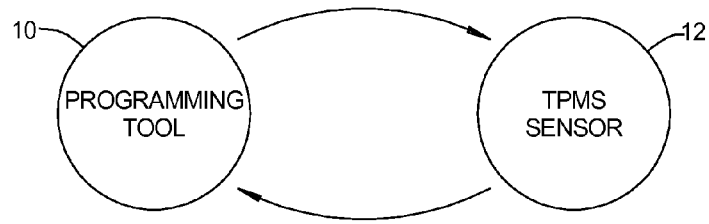

| | | | |
|---|---|---|---|
| 8,335,958 B2 * | 12/2012 | Van Den Hamer et al. | 714/748 |
| 8,413,000 B2 * | 4/2013 | Sorbara et al. | 714/748 |
| 8,443,266 B2 * | 5/2013 | Sakai | 714/776 |
| 8,799,741 B2 * | 8/2014 | Jeong et al. | 714/758 |
| 8,910,008 B2 * | 12/2014 | Hamada | 714/748 |

* cited by examiner

0 + DataA0 + DataA1 + DataA2 + DataA3 = $CRC_1$ $CRC_1$ + DataB0 + DataB1 + DataB2 + DataB3 = $CRC_2$ $CRC_2$ + DataC0 + DataC1 + Datac2 + DataC3 = $CRC_3$

°
°
°

PROGRAMMING METHOD FOR TIRE PRESSURE MONITOR SENSORS

CROSS-REFERENCE TO RELATED APPLICATIONS

This application claims the benefit of U.S. Provisional Application No. 61/720,434, filed on Oct. 31, 2012. The entire disclosure of the above application is incorporated herein by reference.

FIELD

The present disclosure relates to tire pressure monitor sensors, and more particularly, to a system and method for programming tire pressure monitor sensors.

BACKGROUND AND SUMMARY

This section provides background information related to the present disclosure which is not necessarily prior art.

Tire pressure monitoring systems have been developed, including a tire pressure monitor sensor (TPMS) that is mounted to each wheel for sending signals to a central receiving unit aboard a vehicle for providing information regarding the tire pressure and temperature. Each of the tire pressure monitor sensors includes a respective radio frequency (RF) transmitter that transmits an RF signal in response to the receipt of an LF (low frequency) activation signal. The RF signal includes both an identifier code and an indicator of tire pressure and temperature. Each TPMS is manufactured with a unique identification number which is sent as part of the radio transmission. The IDs of the TPMS's fitted to the vehicle are given to the vehicle so that the vehicle can discriminate between transmissions from its own TPMS's and ones from another vehicle.

During the manufacture of a vehicle, and when the vehicle tires are rotated, the sensor identification and location needs to be stored in the vehicle receiving unit. In order to store the tire pressure monitor sensor identification, the tire pressure monitor sensors need to be activated using an LF antenna coil providing an activate signal. Upon proper activation, the TPMS then transmits its identification as well as the tire pressure. Generally, the transmission from the TPMS is in the form of a radio transmission. Any tool used to obtain the TPMS ID has to make sure that the ID obtained is in fact the correct one, and not from a TPMS transmitting nearby.

Some aftermarket TPMS sensors are programmable sensors that are programmed by receiving low frequency data frames at approximately 125 kH. For tire pressure monitor sensors, it is important to ensure that the program is transferred accurately from the programming tool to the programmable sensor. Accordingly, a system, such as a cyclic redundancy check (CRC), is employed so that the receiving TPMS sensor can validate the data received from the programming tool.

A CRC is a form of integrity checksum. It is a method for determining errors in the received data by grouping the bytes of data into a block and calculating a cyclic redundancy check (CRC). The CRC is usually appended to the end of the data frame. The receiver of the frame will then perform the same calculation of the data to generate its own CRC and then compare it against the CRC that was transmitted in the frame. By way of example, a transmitted frame including Data 0, Data 1, Data n, Data n+1, and a CRC value would be confirmed by taking the sum of Data 0+Data 1+Data 2+Data 3=CRC. Thus, the system confirms that the calculated sum value of Data 0 through Data 3 is equal to the CRC that was transmitted with the transmitted data frame. This process would be carried out for each transmitted data frame just to confirm full receipt of the data within each transmitted frame. In a typical communications protocol that does not rely upon the acknowledgement of each individual frame transmitted, or the inclusion of a sequence byte in the data (which is a security vulnerability), it is possible that the receiver may fail to receive such a frame and will ultimately fail to program correctly.

For TPMS, it is not advisable to allow anyone to have the ability to reprogram the sensors, and so encryption of the programming process is used and the absence of unencrypted data helps maintain the security of the system. TPMS sensors may run their processing units at low speed in order to preserve battery life, and may also turn off parts of their circuitry that are not needed. For example, it may be that a TPMS sensor cannot both process low frequency (LF) data and transmit UHF at the same time. One method of programming a sensor using LF is to send data in frames, and for the sensor to validate the data, and then signal using UHF to indicate that the frame was received correctly, before the programming tool sends more LF data. This is a fairly slow process, so improved quicker processes are desired.

Another method of programming a sensor using LF is for the sensor to validate the data, and then only to use UHF to signal that it has detected a problem with the data, or that the process has been successfully completed. In a system where data is being transferred to a programmable sensor by LF in a succession of frames which contains a CRC, it takes time for the TPMS sensor to react to faulty data, and to then transmit a UHF frame to request that the LF data is re-sent.

One solution to this problem would be to leave a large time period between LF data frames, so that the TPMS sensor would have time to request re-sending before the next LF frame is sent. However, this would result in an unnecessarily slow programming process in the usual case where the data is transferred without corruption. If a new LF data frame is sent before the TPMS sensor could have requested re-sending the previous frame, then it is important to know that the tool sending the LF data and the receiving TPMS sensor are both in step. For example, it is possible that the tool might not receive the UHF request so that the TPMS sensor could interpret the next new LF data frame as being the re-sent LF frame.

The present disclosure provides a method of programming a tire pressure monitor sensor to solve the above-described problem. In particular, the present disclosure utilizes a programming tool that transmits LF data frames to the TPMS sensor that includes a cyclic redundancy check (CRC) code with each data frame. The starting point for the subsequent data frame will then start with the CRC code received from the previous frame and will end with a new CRC code. Accordingly, the CRC code received from the previous frame will be used to ensure that the next data frame matches that CRC code as the starting point for that frame. This will ensure that the data frames cannot get out of sequence and will allow the ability to quickly identify where the data frames have gone out of sync and allow the programming tool to quickly react.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
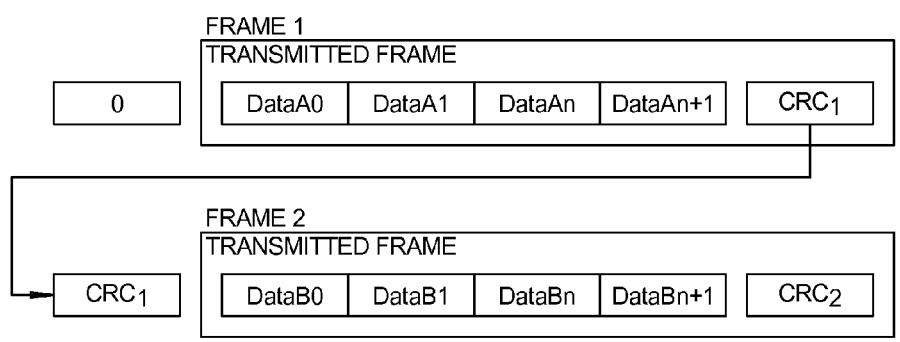

FIG. 1 is a schematic diagram showing a programming tool utilized for programming a TPMS sensor according to the principles of the present disclosure; and FIG. 2 is a schematic diagram representative of the data transmitted in sequential frames for programming a TPMS according to the principles of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

With reference to FIG. 1, a programming tool 10 is shown that is capable of transmitting data to a TPMS sensor 12 for programming the sensor. The sensor 12 is capable of providing signals back to the programming tool 10 that allow the sensor 12 to indicate whether the data was received correctly or incorrectly as will be described in detail herein. With reference to FIG. 1, the programming data sent from the programming tool 10 to the TPMS sensor 12 is in the form of low frequency data frames which includes the programming data, representative by the labels Data A0, Data A1, Data An, and Data An+1 for exemplary purposes. Each data frame is also provided with a CRC, such as the CRC1 provided with the frame 1 data. The valve of $CRC_1$ is equal to the sum of 0+Data A0+Data A1+Data A2+Data A3 which can be confirmed by the receiving TPMS sensor. In a subsequent data frame, the transmitted data frame will be begin with the previous CRC, such as CRC1 so that the sensor can confirm that the CRC code of the subsequent frame matches the CRC code provided in the previous frame prior to accepting the data that is received in that frame 2. The frame 2 would include additional programming data, representative by the labels Data B0, Data B1, Data Bn, and Data Bn+1 which is then accompanied by a second CRC code, for example CRC2 which will then be utilized in the subsequent frame 3 as a confirmation that the proper data frame is being received. In other words, the present disclosure provides for the feedback of a previous CRC into the calculation of the subsequent frame such that unless the previous frame was received correctly, the subsequent frame will fail the validation check and will not proceed until the missing frame is retransmitted. In the illustrative example, the receiving TPMS sensor will confirm that $CRC_2$ is equal to the sum of $CRC_1$+Data B0+Data B1+Data B2+Data B3. In such a case that the received $CRC_2$ value does not match the calculated $CRC_2$ value, the TPMS sensor will notify the transmitting programming tool that there was a CRC error at a given point in the process and the programming tool will resume from the point of failure. This will ensure that the transmission of the data frames can never get out of sequence, and it will also allow the TPMS sensor and programming tool to quickly identify where the data transmission has gone out of sync and react. This is important in the relatively long time taken to program a TPMS sensor. It is not beneficial or efficient to wait until the full programming time has expired before declaring a failure, if the process could be failed or corrected at a much earlier stage. This method also has the advantage of no plain text transfer, which helps maintain the security of the programming process.

It is noted that FIG. 2 illustrates the CRC1 and subsequent CRC calculation according to the principles of the present disclosure. It is noted that other modifications to this calculation process could be utilized.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of programming a tire pressure monitor (TPMS) sensor, comprising:

transmitting a first data frame with a programming tool to the TPMS sensor, the first data frame including a first cyclic redundancy check (CRC) code;

transmitting a second data frame with the programming tool to the TPMS sensor, the second data frame starting with the first CRC code received from the first data frame and ending with a second CRC code; and confirming that the first CRC code received from the second data frame matches the first CRC code received from the first data frame to ensure that the second data frame matches the first CRC code as the starting point for the second data frame.

2. The method according to claim 1, further comprising transmitting a series of subsequent data frames with the programming tool to the TPMS sensor, the series of subsequent data frames starting with the CRC code sent with an immediately prior data frame and ending with a new CRC code; and confirming that the CRC code received from an end of an immediately prior data frame matches the CRC code beginning a subsequently received data frame to ensure that the CRC code from the previously received data frame matches the CRC code as the starting point for the subsequent data frame.

3. The method according to claim 2, further comprising re-transmitting a data frame in response to an error signal generated in response to the TPMS sensor indicating that the CRC code from the previously received data frame does not match the CRC code as the starting point for the subsequent data frame.

\* \* \* \* \*